(12) United States Patent
Wills et al.

(10) Patent No.: US 6,355,973 B1
(45) Date of Patent: Mar. 12, 2002

(54) INTEGRATED CIRCUIT HAVING A SEALED EDGE

(75) Inventors: Kendall Scott Wills, Houston; Paul Anthony Rodriguez, Lewisville, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/485,199

(22) Filed: Jun. 7, 1995

Related U.S. Application Data

(62) Division of application No. 07/658,118, filed on Feb. 20, 1991, now Pat. No. 5,451,550.

(51) Int. Cl.[7] .............................................. H01L 23/538
(52) U.S. Cl. ..................... 257/620; 257/729; 257/730
(58) Field of Search ................................. 257/644, 650, 257/634, 687, 758, 736, 777, 778, 620, 624, 729, 730

(56) References Cited

U.S. PATENT DOCUMENTS

| | | | | |
|---|---|---|---|---|
| 3,918,079 A | * | 11/1975 | Youmans ..................... 257/736 |
| 4,259,682 A | * | 3/1981 | Gamo ......................... 257/620 |
| 4,317,086 A | * | 2/1982 | Scifres et al. ............... 257/634 |
| 4,477,828 A | | 10/1984 | Scherer ....................... 357/74 |
| 4,633,573 A | | 1/1987 | Scherer ....................... 437/211 |
| 4,782,787 A | | 11/1988 | Roche ......................... 118/728 |
| 4,807,016 A | * | 2/1989 | Douglas ....................... 156/643 |
| 4,835,592 A | * | 5/1989 | Zommer ....................... 257/620 |
| 4,992,847 A | * | 2/1991 | Tuckerman .................... 257/777 |
| 5,051,865 A | * | 9/1991 | Kato .......................... 257/686 |
| 5,317,186 A | * | 5/1994 | Wills et al. .................. 257/620 |
| 5,451,550 A | * | 9/1995 | Wills et al. .................. 437/235 |

FOREIGN PATENT DOCUMENTS

| | | | | |
|---|---|---|---|---|
| DE | 27 30 367 | * | 1/1989 | ................. 257/634 |
| EP | 0342681 | | 11/1989 | ................. 437/211 |
| JP | 54-131873 | * | 10/1979 | ................. 257/620 |
| JP | 55-0093227 | | 7/1980 | ................. 437/211 |
| JP | 61-0148824 | | 7/1986 | ................. 437/211 |
| JP | 62-124768 | * | 6/1987 | ................. 257/66 |
| JP | 87-0120053 | | 6/1987 | |

OTHER PUBLICATIONS

Sze, *Semiconductor Devices: Physics and Technology*, 1985, pp. 381–382 and 417–420.*

* cited by examiner

*Primary Examiner*—David Hardy
(74) *Attorney, Agent, or Firm*—Ronald O. Neerings; W. James Brady, III; Frederick J. Telecky, Jr.

(57) ABSTRACT

A semiconductor die is enveloped by an ambient gas that will react to the presence of a particular wave length of light. A laser beam is focused on the edge of the die to deposit a dielectric coating. The laser beam or the die is rotated until the dielectric coating covers the entire die edge. The dielectric coating acts as a seal that is impervious to water and other contamination that can reduce the die reliability. The dielectric coating also electrically insulates the die from its surroundings.

14 Claims, 3 Drawing Sheets

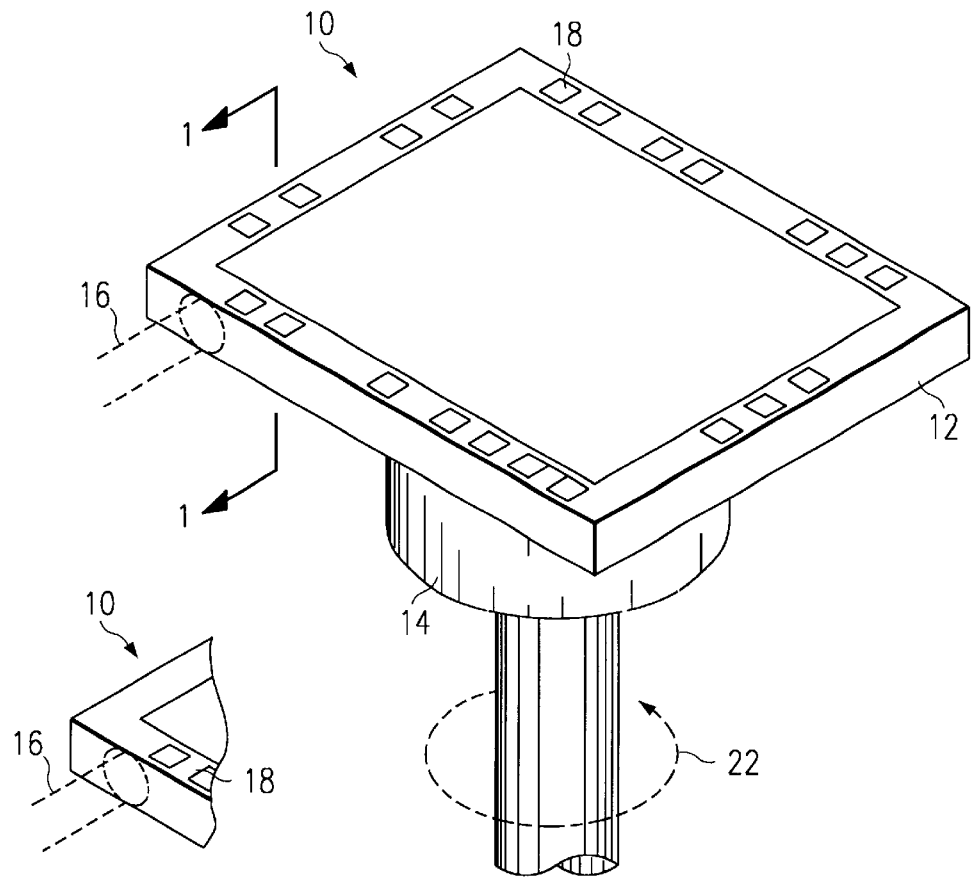
FIG. 2
FIG. 1
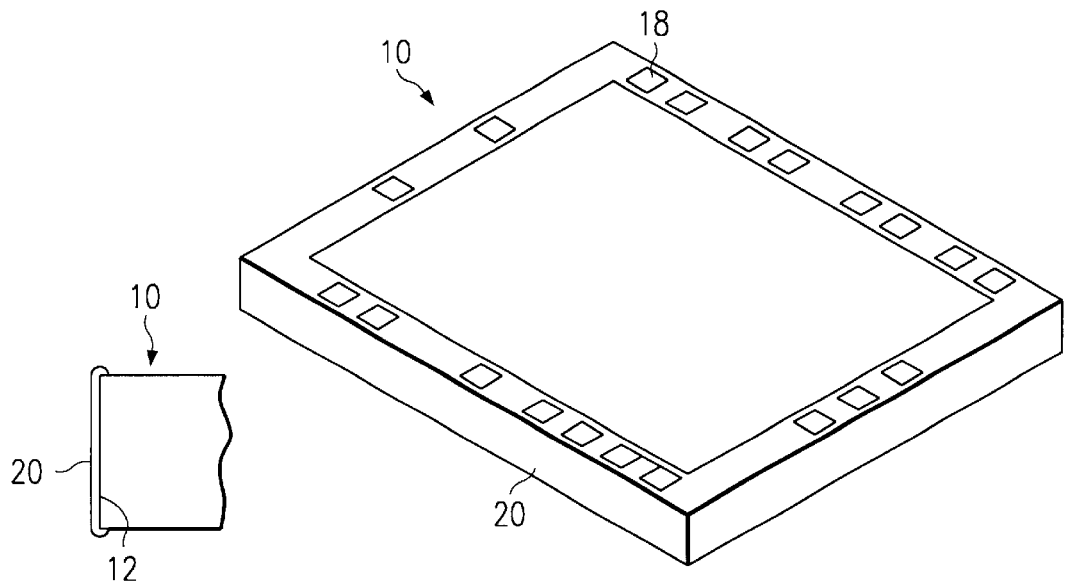
FIG. 4
FIG. 3

INTEGRATED CIRCUIT HAVING A SEALED EDGE

This is a division of application Ser. No. 07/658,118, filed Feb. 20, 1991, now U.S. Pat. No. 5,451,550.

FIELD OF THE INVENTION

This invention relates to sealing a semiconductor die edge, and more particularly to laser CVD sealing a semiconductor die edge.

BACKGROUND OF THE INVENTION

A semiconductor die is subject to reliability failure if contamination from the outside world enters the device. One likely entrance location for contamination in a semiconductor die is the edge of the die. Semiconductor manufacturers typically fabricate a diffused line or region around the edge of the die to lessen the possibility of this form of contamination. The diffused line or region may also be biased to ensure entrapment of contamination in the diffused region.

A protective overcoat may also be placed over the die to prevent contamination from entering the die through the top surface. The protective overcoat extends past the die edge to help the diffused region capture the contamination. But even these precautions will not prevent contamination from entering the active region of the die through irregularities in the diffused line or region.

Irregularities are introduced into the die when the slice containing the die is scribed and broken. The scribe operation is a rough mechanical procedure that can damage the protective structures used to prevent contamination from entering the die from the die edge. The damage generally manifests itself in the form of cracks and nicks in the protective structures. Normal final testing may fail to detect cracks which, unfortunately, show up after the die has been in the field for some time.

Incidental field failures may also occur when bond wires droop during assembly. The bond wire may get close or electrically contact the die edge altering the signal to the die by shorting the die edge.

What is needed is a method to prevent contamination from entering a die through cracks in the edge of the die. What is also needed is a method to prevent bond wires or bond tracks, which run across the die edge, from shorting to the die or one another due to conduction through the die.

SUMMARY OF THE INVENTION

In accordance with one embodiment of the invention, a die is enveloped by an ambient gas that will react to the presence of a particular wave length of light. A laser beam is focused on the edge of the die. The gas undergoes a photo chemical or pyrolytic reaction on the die edge to deposit a dielectric coating. The laser beam or the die is rotated until the dielectric coating covers the entire die edge. The dielectric coating acts as a seal that is impervious to water and other contamination that can reduce the die reliability. The dielectric coating also electrically insulates the die from its surroundings.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a perspective view of one embodiment of the invention.

FIG. 2 is a sectional view, enlarged, of the device of FIG. 1, taken along the line 1—1.

FIG. 3 is a perspective view of a die having a dielectric coating deposited on the edge of the die, according to one embodiment of the invention.

FIG. 4 is a side sectional view, enlarged, of the device of FIG. 3, taken along the line 2—2.

DETAILED DESCRIPTION OF THE INVENTION

Figure 5:
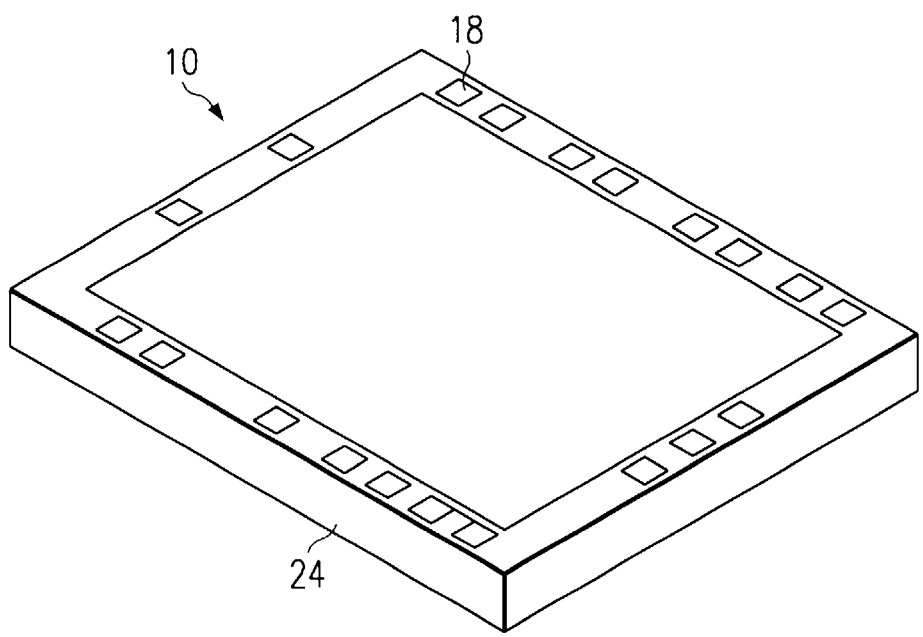
FIG. 5 is a perspective view of a die having a conductive coating over the edge of the die, according to another embodiment of the invention.

FIG. 1 discloses a die 10 having an edge 12. The size and shape of die 10 and edge 12 are merely descriptive for the purposes of this application. In practice, dies and die edges will exist in various sizes and shapes. In FIG. 1, die 10 is placed on a support surface 14 within an ambient gas or liquid atmosphere. Examples of acceptable ambient gasses when annealing with a dopant include PCL3, BCL3 and B[CH3]3. For a nitride, typical gasses include NH4 and SICL2. For an oxide, typical gasses include O2 and SICL2. If annealing is desired without a dopant, an atmosphere of oxygen or a vacuum is used in lieu of ambient gasses.

Next, a laser beam 16 is focused on the edge 12 of die 10. Laser beam 16 should overlap the edge 12 of the die 10 but not hit any of the bond pads 18, as shown in FIG. 2. Lasers used as sources of heat for pyrolytic deposition of silicon and other materials such as Al, W, Ti and AlO2 are ideal for the purpose. In practice, any laser capable of annealing the die can be used. Other sources of localized heating, such as electron beam, focused Ion beam mill or highly focused incoherent light, can be substituted for the laser. Other lasers which can deposit materials by causing a chemical reaction through the absorption of energy into energy bands below the disassociation energy of the molecule can also be used.

Figure 9:
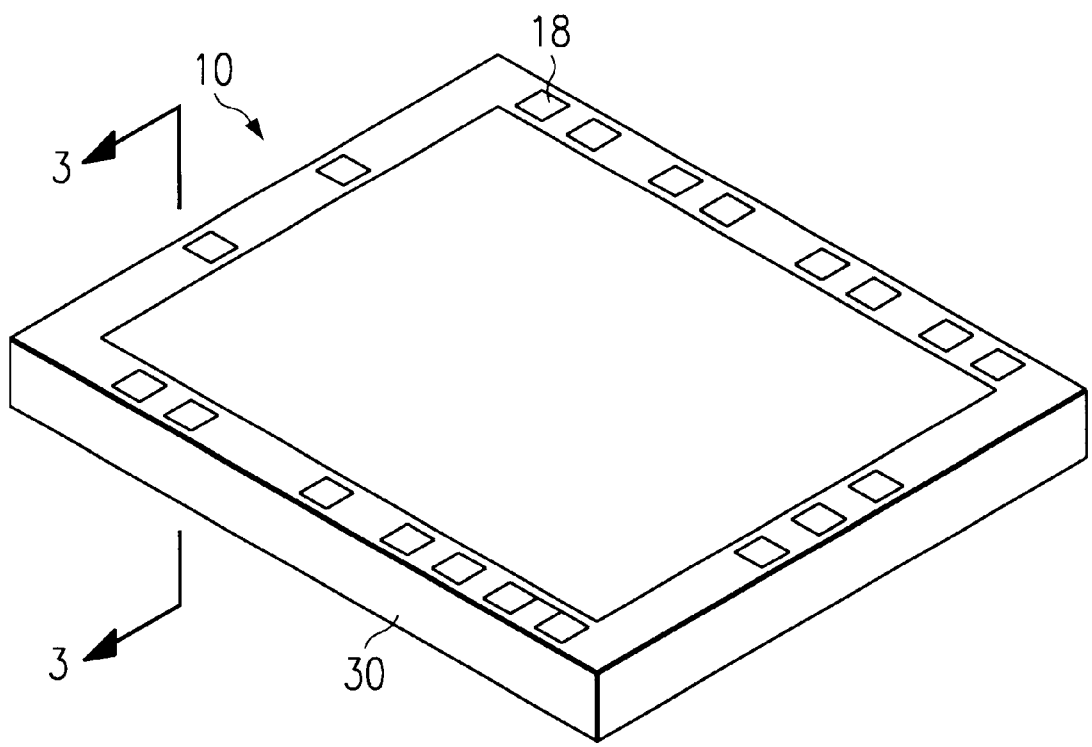
FIG. 9 is a perspective view of a die having an annealed die edge, according to another embodiment of the invention.
Figure 10:
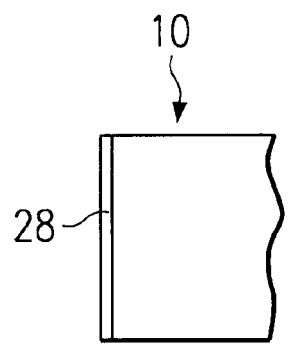
FIG. 10 is a side sectional view, enlarged, of the device of FIG. 9, taken along the line 3—3.

When annealing without a dopant, an atmosphere of oxygen or a vacuum is used in lieu of ambient gasses. Laser beam 16 is focused on the edge 12 of die 10. Laser beam 16 should overlap the edge 12 of the die 10 but not hit any of the bond pads 18, as shown in FIG. 2. Support surface 14 or laser beam 12 is rotated in the direction of arrow 22 until die edge 12 is annealed 30, as illustrated in FIG. 9. For best results, the entire die edge should be annealed. Image processing is used to track the annealing.

When annealing with a dopant, the ambient gas reacts to the presence of the laser beam 16 which is incident upon the die edge 12. The ambient gas undergoes a photo chemical reaction on the die edge 12 to deposit a dielectric coating 20. Support surface 14 or laser beam 16 is rotated in the direction of arrow 22 until a dielectric coating 20 is deposited completely around die 10 along die edge 12. The entire surface of die edge 12 must be covered by dielectric coating 20 for best results. Image processing is used to track the deposition. The dielectric coating acts as a seal that may be impervious to water and other contamination that reduce die reliability. The dielectric coating also electrically insulates the die from its surroundings. FIGS. 3 and 4 show a die 10 having its entire die edge 12 covered by dielectric coating 20.

Figure 6:
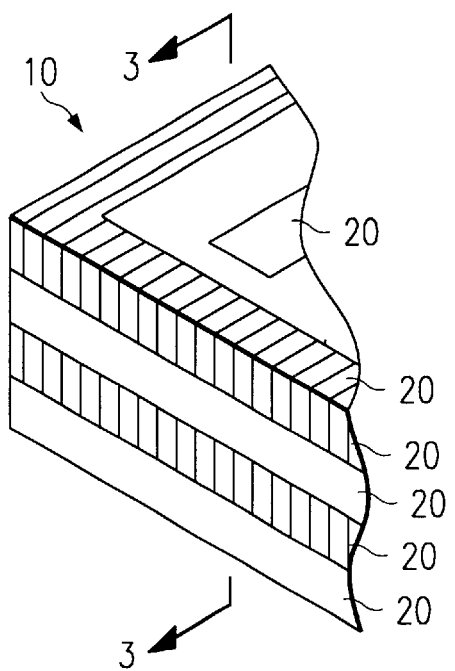
FIG. 6 is a sectional view of a die according to another embodiement of the invention.
Figure 7:
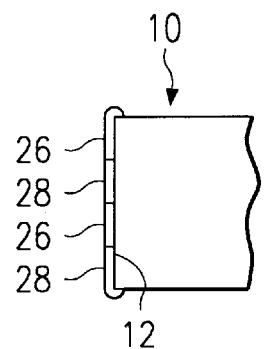
FIG. 7 is a side sectional view, enlarged, of the device of FIG. 6, taken along the line 3—3.
Figure 8:
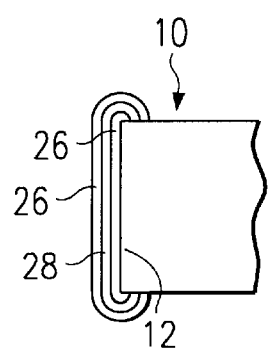
FIG. 8 is a side sectional view of a die according to yet another embodiment of the invention.

The application of a dielectric coating to the edge of a die effectively seals both cracked and uncracked die edges. The dielectric coating may be a nitride, an oxide or a combination of the two. In situations where the shorting of bond wires to the die edge is not a problem, a conductive die edge of silicon or other conductive materials may be substituted for the dielectric coating. FIG. 5 shows a die having its entire die edge 12 covered by a conductive die edge 24. It is also possible to have a protective coating of alternate dielectric layers 26 and conductive layers 28, as shown in FIGS. 6, 7, and 8.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor device, comprising:
   a die, said die having a top surface, a bottom surface and an annealed edge.

2. The semiconductor device of claim 1, wherein said edge comprises side surfaces.

3. The semiconductor device of claim 2, wherein there are four side surfaces.

4. The semiconductor device of claim 1, wherein said top surface includes bond pads.

5. The semiconductor device of claim 4, wherein a portion of said top surface is annealed adjacent said annealed edge.

6. The semiconductor device of claim 1, wherein a portion of said top surface is annealed adjacent said annealed edge.

7. The semiconductor device of claim 6, wherein said annealed portion of said top surface is spaced from bond pads on said top surface and does not include a central portion of said top surface.

8. The semiconductor device of claim 6, wherein said annealed portion of said top surface is the circumference of said top surface.

9. The semiconductor device of claim 1, further including a conductive layer formed on said annealed edge.

10. The semiconductor device of claim 9, further including at least one more conductive layer formed on said annealed edge.

11. The semiconductor device of claim 9, wherein said conductive layer completely covers said annealed edge.

12. A semiconductor die, comprising:
    a top surface having bond pads;
    a bottom surface;
    side surfaces between said top and bottom surfaces;
    a protective coating on said side surfaces and the circumference of said top surface, said protective coating not contacting said bond pads or a central portion of said top surface; and
    a conductive layer formed on said protective coating.

13. The semiconductor die of claim 12, wherein said conductive layer is horizontally oriented on said protective coating.

14. The semiconductor die of claim 13, wherein said conductive layer extends onto a portion of said top surface, said portion being spaced from said bond pads.

* * * * *